(12) United States Patent
Terasaki et al.

(10) Patent No.: US 6,331,730 B1
(45) Date of Patent: Dec. 18, 2001

(54) PUSH-IN TYPE SEMICONDUCTOR DEVICE INCLUDING HEAT SPREADER

(75) Inventors: Takeshi Terasaki, Ibaraki-ken; Hideo Miura, Koshigaya; Chikara Nakajima, Kitaibaraki; Makoto Kitano, Tsuchiura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/296,466

(22) Filed: Apr. 22, 1999

(30) Foreign Application Priority Data

Apr. 23, 1998 (JP) .................................................. 10-113035

(51) Int. Cl.⁷ ........................... H02K 19/36; H01L 23/36; H01L 23/28; H01L 23/32; H01L 21/58
(52) U.S. Cl. ........................ 257/688; 257/689; 257/712; 257/658; 257/732; 257/719; 257/699; 361/388; 361/386
(58) Field of Search .................................... 257/688, 658, 257/689, 730–732, 712, 713, 720, 699, 719, 181, 180; 361/386, 388

(56) References Cited

U.S. PATENT DOCUMENTS

| | | | |
|---|---|---|---|
| 3,299,328 | * | 1/1967 | Martin et al. . |
| 3,315,136 | * | 4/1967 | Lob . |
| 3,708,722 | * | 1/1973 | Wiles . |
| 3,713,007 | * | 1/1973 | Walter . |
| 3,743,894 | * | 7/1973 | Weisk et al. . |
| 4,196,775 | * | 4/1980 | Groh . |
| 4,349,831 | * | 9/1982 | Theroux . |
| 4,760,037 | * | 7/1988 | Ohdate . |
| 5,206,793 | * | 4/1993 | Boudrant et al. ..................... 257/689 |
| 5,760,425 | * | 6/1998 | Kobayashi et al. ................... 257/688 |
| 5,886,403 | * | 3/1999 | Yoshinaga et al. ................... 257/688 |

FOREIGN PATENT DOCUMENTS 5-114678  5/1993 (JP) .

* cited by examiner

*Primary Examiner*—Alexander O. Williams
(74) *Attorney, Agent, or Firm*—Antonelli, Terry, Stout & Kraus, LLP

(57) ABSTRACT

A push-in type semiconductor chip has a semiconductor device, a support electrode body bonded to one of the end portions of the semiconductor chip and supported by, and fixed to, a heat spreader at a support fixing portion thereof, a lead electrode body bonded to the other end portion of the semiconductor chip and an insulating/sealing member disposed at the bond portion between the semiconductor chip and the support electrode body and at the bond portion between the semiconductor chip and the lead electrode body. The support electrode body includes a first portion having an outer diameter different from that of the support fixing portion at which the support electrode body is supported and fixed by the heat spreader. By setting a predetermined relationship between the outer diameters of the first portion and the support fixing portion, deformation and breakage of the semiconductor chip during assembly can be prevented.

19 Claims, 7 Drawing Sheets c : MAXIMUM OUTER DIAMETER OF SUPPORT ELECTRODE BODY
d : MAXIMUM OUTER DIAMETER OF PORTION OTHER THAN PORTION SUPPORTED BY, AND FIXED TO, HEAT SPREADER a : THICKNESS FROM SEMICONDUCTOR CHIP MOUNTING SURFACE TO ITS BACK
b : THICKNESS OF PORTION CONTACTING WITH HEAT SPREADER
c : MAXIMUM OUTER DIAMETER OF SUPPORT ELECTRODE BODY a : THICKNESS FROM SEMICONDUCTOR CHIP MOUNTING SURFACE TO ITS BACK
b : THICKNESS OF PORTION CONTACTING WITH HEAT SPREADER
c : MAXIMUM OUTER DIAMETER OF SUPPORT ELECTRODE BODY a : THICKNESS FROM SEMICONDUCTOR CHIP MOUNTING SURFACE TO ITS BACK
b : THICKNESS OF PORTION CONTACTING WITH HEAT SPREADER
c : MAXIMUM OUTER DIAMETER OF SUPPORT ELECTRODE BODY

PUSH-IN TYPE SEMICONDUCTOR DEVICE INCLUDING HEAT SPREADER

BACKGROUND OF THE INVENTION

The present invention relates to a semiconductor device for converting an AC output of an AC generator to a DC output. More particularly, the present invention relates to a semiconductor device which will be suitable for preventing defects of characteristics of a semiconductor chip which defects are induced when the semiconductor chip is pushed and fixed to a heat spreader (heat radiation plate).

In semiconductor devices according to the prior art for converting the AC output of AC generators to the DC output, the semiconductor chip is fixed, for example, to a flat portion of a bottom plate of a dent support electrode body, and the dent support electrode body is in turn pushed into a metal heat spreader having electrical conductivity and heat transferability, as described in JP-A-55-19828.

SUMMARY OF THE INVENTION

It is an object of the present invention to provide a semiconductor device which can prevent breakage resulting from deformation and can reduce the force acting on the semiconductor chip at the time of assembling, and can reduce the degree of deformation.

It is another object of the present invention to provide a semiconductor device which has long service life as well as high reliability.

It is still another object of the present invention to provide a semiconductor device which can be fabricated at a low cost of production.

The semiconductor chip portion of the conventional push-in type semiconductor devices described above is sealed by an insulating material for the purpose of insulation and protection. Though a silicone rubber has been used in many cases, an epoxy resin has been used, too, in some cases.

The heat spreader supporting/fixing structure of the semiconductor device by the push-in operation is achieved by boring a circular fitting hole having an inner diameter somewhat smaller than an outer diameter of the support electrode body in the heat spreader and fitting the support electrode body into this fitting hole by applying a load to the support electrode body.

Therefore, when the semiconductor device having the conventional structure is pushed into the heat spreader, a large force is applied to the semiconductor chip through the support electrode body, and the semiconductor chip is broken in some cases during this push-in operation. This problem can be solved, in principle, by interposing a sheet-like intermediate member between the support electrode body and the semiconductor chip, but this method is not desirable because the cost of production drastically increases due to the increase in the number of components and due to deterioration of the assembly working factor. In addition, the side wall of the dent support electrode body undergoes deformation to the inner peripheral side during the push-in operation and the insulating member is compressed. When an epoxy resin having a large Young's modulus is used for the insulating member, the force resulting from this deformation is transferred to the semiconductor chip, so that breakage of the semiconductor chip is more likely to occur.

Therefore, a push-in test is carried out by producing a prototype structure which reduces much more the force transferred from the support electrode body to the semiconductor chip during the push-in operation than in the conventional structure, and which is shown in FIG. 2. In order to prevent the curve of the support electrode structure 3 by the compressive force applied from the heat spreader 4, the support electrode body in this prototype structure is made thicker than in the conventional structure. The semiconductor chip is sealed by the epoxy type resin. The result of the experiment reveals that breakage such as the transverse crack from the outer peripheral side and the longitudinal crack from any surface including the upper or the lower surface is observed in some cases in the semiconductor chip 1 as shown in FIG. 2. It is assumed that the breakage develops because the function of reducing the force applied from the support electrode body 3 to the semiconductor chip 1 is not sufficient.

Another problem occurs in that the insulating member 7 peels from the support electrode body 3 due to the contact of the support electrode body 3 with the heat spreader 4 during the push-in operation. This is because the support electrode body undergoes great deformation due to the force applied to it from the heat spreader 4. When the semiconductor device is used in the environment in which the semiconductor chip is likely to be exposed to moisture, the moisture may enter from this peel portion and will invite the problem of the drop of the rectification operation due to the increase of a leakage current that flows in the opposite direction.

These problems can be solved by reducing the force applied to the semiconductor chip through the support electrode body and through the insulating material. They can be also solved by reducing deformation of the support electrode body due to the push-in operation in the proximity of the bonding surface between the support electrode body and the insulating member.

In a semiconductor device including a semiconductor chip, a support electrode body bonded to one of the ends of the semiconductor chip through a bonding member and equipped with a heat spreader fixing portion on the outer periphery thereof for supporting and fixing a heat spreader, a lead electrode body bonded to the other end of the semiconductor chip through a bonding member and an insulating member disposed at the bond portion between the semiconductor chip and the support electrode body and at the bond portion between the semiconductor chip and the lead electrode body, the semiconductor device according to the present invention has the following structural requirements.

(1): A first portion having a different outer diameter from that of the heat spreader fixing portion is formed on the support electrode body.

(2): In the construction (1) described above, the outer diameter of the first portion is not greater than 0.95 times the outer diameter of the heat spreader fixing portion.

This construction can solve the problems described above because the force transferred from the heat spreader is dispersed inside the support electrode body.

According to the result of the experiments and to the examination result by numerical analysis conducted by the inventor of the present invention, it has been found that if the outer diameter of the circular cylindrical shape or the maximum outer diameter of the circular truncated conical shape on the chip mounting surface side is not greater than 0.95 times the outer diameter of the support electrode body as shown in FIG. 3, the stress developing in the semiconductor chip is below the breaking stress limit.

(3): In the construction (1) or (2) described above, a cylindrical side wall is formed on the semiconductor chip mounting surface side of the support electrode body, and the inner diameter of the side wall on the opposite side to the support electrode body side is smaller than the inner diameter on the support electrode side.

This construction can prevent peel of the insulating member from the support electrode body. Further, a similar effect can be obtained by forming a lead protuberance portion on the lead extending up from the header surface of the lead electrode body in such a fashion that a part, or the entire part, of the protuberance portion comes into contact with the insulating member.

(4): In the construction (1) or (2) described above, the difference of thickness obtained by subtracting the thickness of the contact portion of the support electrode body, which is in contact with the heat spreader, from the thickness between the semiconductor chip mounting surface and its bank is from 0.07 to 0.25 times, or at least 0.47 times, the maximum outer diameter of the support electrode body.

According to the result of the experiments and the examination result by numerical analysis conducted by the present inventor, both transverse and longitudinal cracks of the semiconductor chip at the time of the push-in operation shown in FIG. 2 as well as peel of the insulating member can be prevented within the range of the numerical values described above.

(5): In the construction (1) or (2) described above, a second portion is formed on the support electrode body between the heat spreader fixing portion and the first portion, and the outer diameter of this second portion is smaller than the outer diameter of the heat spreader fixing portion and the outer diameter of the first portion.

According to this construction, the force applied from the heat spreader to the support electrode body is cut off at the second portion (hereinafter referred to as the "ditch"). In consequence, the force acting on the semiconductor chip and on the interface between the insulating member and the support electrode body can be drastically reduced, and breakage of the semiconductor chip as well as peel between the insulating member and the support electrode body can be prevented.

(6): In the construction (1) or (2) described above, a sheet-like member is interposed between the semiconductor chip and the support electrode body.

According to this construction, the semiconductor chip is mounted to the support electrode body through the sheet-like member (semiconductor chip mounting plate). Consequently, the force transferred from the support electrode body to the semiconductor chip in the push-in operation can be reduced, and fatigue life of the bonding members can be improved, too.

In the construction (1) or (2), further, the longitudinal elastic modulus of the insulating member within the temperature range of its use is preferably at least 5 Gpa and its coefficient of linear expansion is preferably from 5 to 50 ppm/°C.

The inventor of the present invention has examined the influences of the Young's modulus of the insulating member and its coefficient of linear expansion on thermal fatigue life of the semiconductor device through experiments and numerical analyses, and has found that when the Young's modulus of the insulating member and its coefficient of linear expansion within the temperature range of its use are within the range of the numerical values given above, the allowable values of thermal fatigue life can be exceeded.

In the construction (1) or (2) described above, when the Vickers hardness of the support electrode body is higher than the Vickers hardness of the heat spreader to which the support electrode body is pushed in, the heat spreader undergoes great deformation during the push-in operation, whereas deformation of the support electrode body becomes smaller. Therefore, breakage of the semiconductor chip and peel between the insulating member and the support electrode body can be prevented. According to the experiments carried out by the present inventor, zircon copper or tin-containing copper or silver-containing copper or chromium-containing copper is preferably used when the material of the heat spreader is oxygen-free copper.

As described above, the present invention can reduce the force applied to the semiconductor chip when it is pushed into the heat spreader, and can therefore prevent breakage of the semiconductor chip.

Thermal fatigue life of the bonding member for connecting the semiconductor chip and the electrode body can be improved by optimizing the material characteristics of the insulating resin, and life of the semiconductor device till degradation of its characteristics can be improved.

BRIEF DESCRIPTION OF THE DRAWINGS

FIG. 3 is a graph showing the relation between an outer diameter of portions other than the portion supported by, and fixed to, a heat spreader and breakage of a semiconductor chip at the time of push-in;

FIG. 4 is a graph showing the relation between the thickness of a support electrode body and side surface breakage of the semiconductor chip at the time of push-in;

FIG. 5 is a graph showing the relation between the thickness of the support electrode body and peel of an interface between an insulating member and the support electrode body at the time of push-in;

FIG. 6 is a graph showing the relation between the thickness of the support electrode body and breakage of the semiconductor chip surface at the time of push-in;

DESCRIPTION OF THE PREFERRED EMBODIMENTS

Preferred embodiments of the present invention will be described hereinafter in detail with reference to the accompanying drawings.

[First Embodiment]

Figure 1:
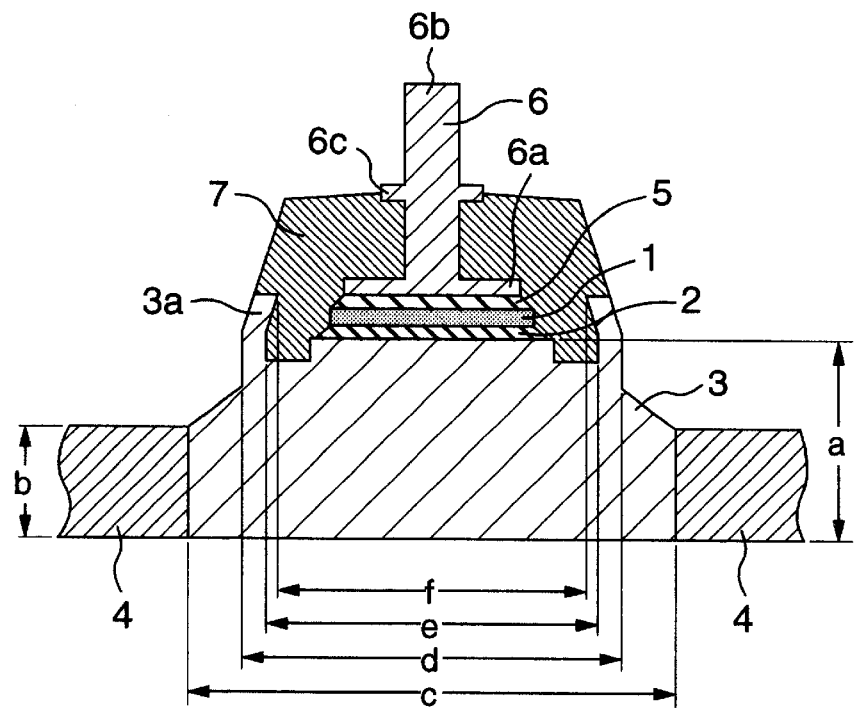
FIG. 1 is a sectional view of a semiconductor device according to the first embodiment of the present invention.

FIG. 1 is a sectional view showing a semiconductor device according to the first embodiment of the present invention. The semiconductor device of this embodiment comprises a semiconductor chip 1 having a rectification function, a support electrode body 3 bonded electrically to one of the end portions of the semiconductor chip 1 through a bonding member 2, and supported by, and fixed to, a heat radiation plate 4 for conducting heat from the semiconductor chip 1, a lead electrode body 6 electrically bonded to the other end portion of the semiconductor chip 1 through a bonding member 5 and an insulating member 7 for insulating and molding the bond portions between the semiconductor chip 1 and both electrode bodies 3 and 6.

The support electrode body 3 has a circular cylindrical or circular truncated conical shape having an outer diameter d which is different from an outer diameter c of a portion at which the support electrode body 3 is supported by, and fixed to, the heat spreader 4. According to experiments and numerical analyses carried out by the present inventor, the stress occurring in the semiconductor chip 1 is below a breaking stress limit when the outer diameter d of the support electrode body 3 on the side of the semiconductor chip mounting surface is not greater than 0.95 times the outer diameter c of the portion which is in contact with the heat radiation plate 4.

The outer diameter of the circular cylindrical shape or the circular truncated conical shape on the chip mounting surface side, which is defined hereby, is a target value for production, and production tolerance is allowed for up to about 1% of the maximum outer diameter of the support electrode body. Similar production tolerance (1% of maximum outer diameter of support electrode body) is allowed to the stipulated values of the dimensions, which will be described later.

Figure 2:
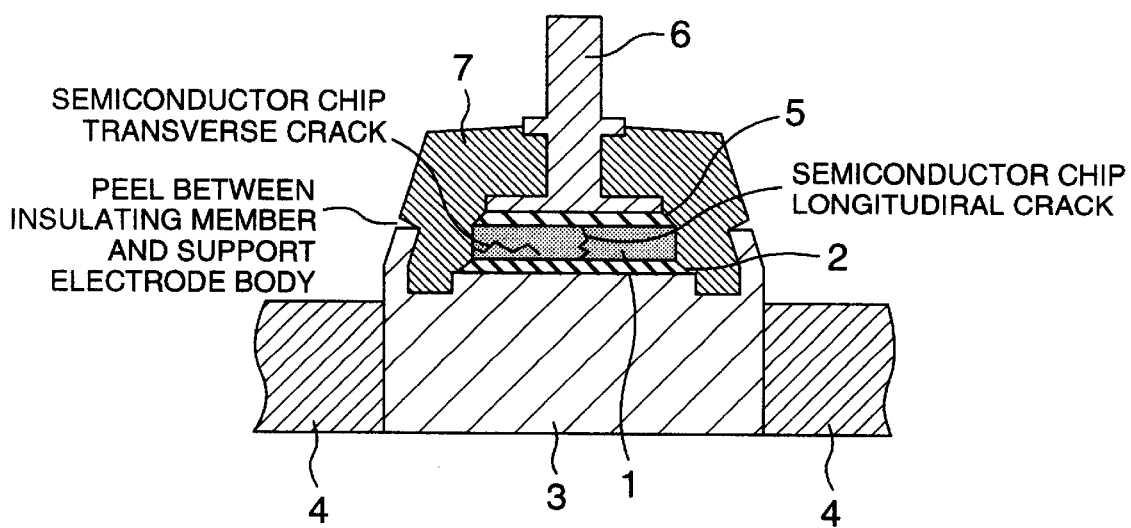
FIG. 2 is a sectional view showing a portion which is likely to be broken at the time of push-in in the construction of an initial examination.
Figure 3:
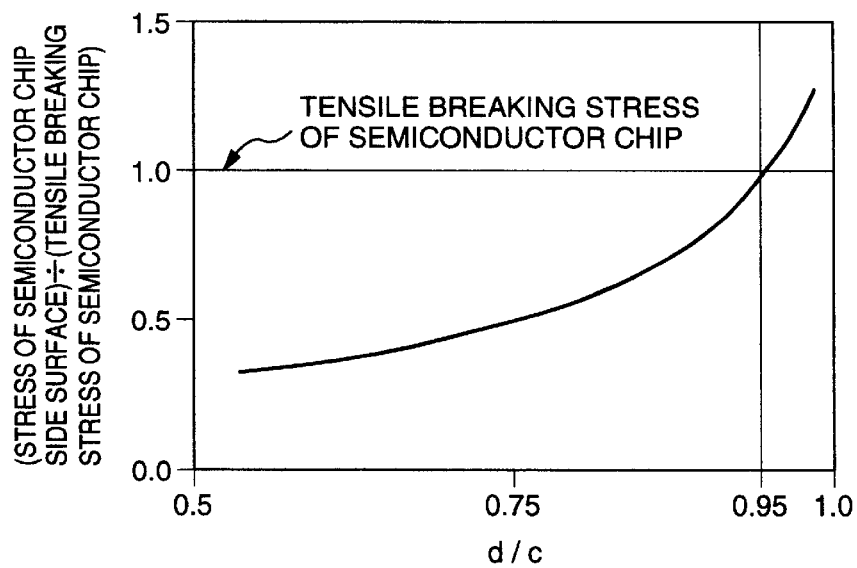

According to the experiments and numerical analyses carried out by the present inventor, both transverse and longitudinal cracks of the semiconductor chip 1 and peel of the insulating member 7 at the time of push-in, shown in FIG. 2, can be prevented when the thickness as the difference obtained by subtracting the thickness b of the portion of the support electrode body 3, which is in contact with the heat radiation plate 4, from the thickness a of the support electrode body 3 from its semiconductor chip mounting surface to its back is 0.07 to 0.25 times, or at least 0.47 times, the maximum outer diameter c of the support electrode body 3.

Figure 4:
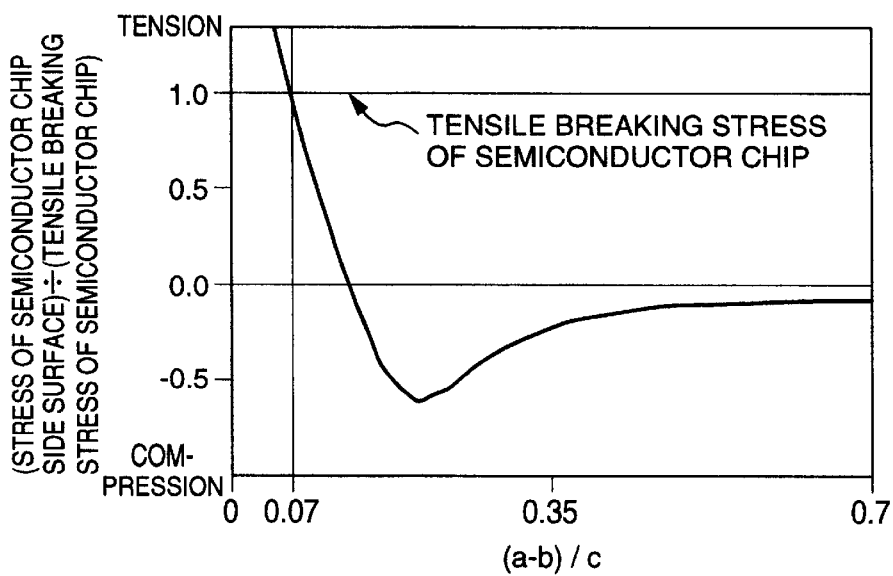

FIG. 4 shows that when the difference of thickness obtained by subtracting the thickness b of the portion of the support electrode body 3, which is contact with the heat spreader 4, from the thickness a of the support electrode body 3 from its semiconductor chip mounting surface to its back is at least 0.07 times the maximum outer diameter of the support electrode body 3, it becomes possible to prevent transverse crack of the semiconductor chip 1 shown in FIG. 2.

Figure 5:
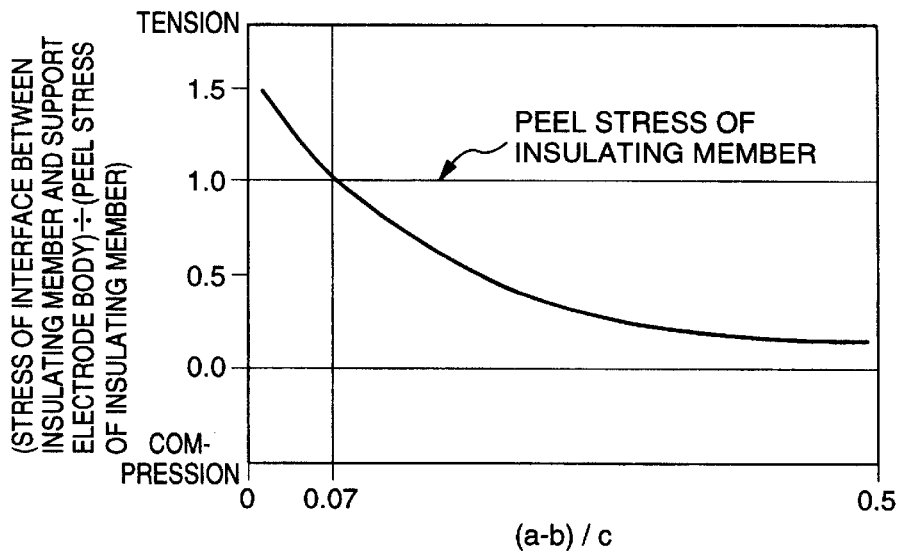

FIG. 5 shows that when the difference of thickness obtained by subtracting the thickness b of the portion of the support electrode body 3, which is contact with the heat spreader 4, from the thickness a of the support electrode body 3 from its semiconductor chip mounting surface to its back is at least 0.07 times the maximum outer diameter of the support electrode body 3, it becomes possible to prevent exfoliation of the semiconductor chip 1 shown in FIG. 2.

Figure 6:
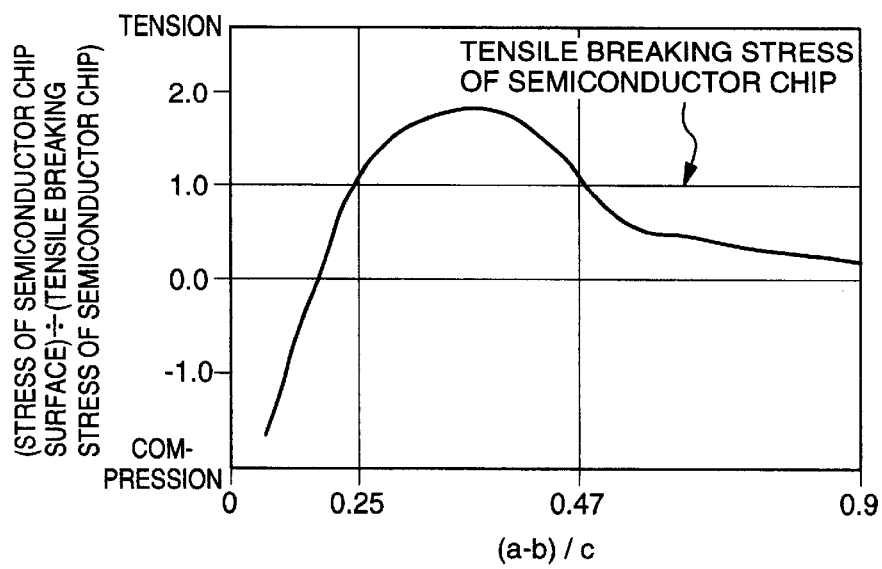

FIG. 6 shows that when the difference of thickness obtained by subtracting the thickness b of the portion of the support electrode body 3, which is in contact with the heat spreader 4, from the thickness a of the support electrode body 3 from its semiconductor chip mounting surface to its back is not greater than 0.25 times, or at least 0.47 times, the maximum outer diameter c of the support electrode body 3, it is possible to prevent longitudinal crack of the semiconductor chip 1 shown in FIG. 2.

Both electrode bodies 3 and 6 are generally made of a copper type metal having high electrical conductivity and a high thermal conductivity. An aluminum type metal which is light in weight and has a high thermal conductivity, or an iron type metal having a smaller coefficient of linear expansion than those of copper and aluminum, may be used, too. The material of both electrode bodies 3 and 6 must be one that is electrically and thermally conductive and that can be pushed into the heat spreader 4.

Knurling (not shown) comprising a large number of very small ridges in an axial direction is formed on the outer peripheral surface of the portion of the support electrode body 3 that is in contact with the heat spreader 4. On the other hand, a round fitting hole having an inner diameter, which is somewhat smaller than the outer diameter of the support electrode body 3, is bored in the heat spreader 4 in order to support and fix the support electrode body 3, and the support electrode body 3 is pushed in, and fixed to, this fixing hole. Knurling is formed to improve this push-in and fixing effect.

The bonding members 2 and 5 for electrically bonding the semiconductor chip 1 and both electrode bodies 3 and 6 use Pb—Sn type solder having a melting point of about 300° C., and they also play the function of mechanical bonding. Solders having other compositions, or electrically conductive resins, can be used without any problem as long as they are thermally and electrically conductive, can bond the semiconductor chip 1 at a temperature at which it is not functionally spoiled, and can secure bonding between both electrode bodies 3, 6 and the semiconductor chip 1 during the term of use. For example, solders of a Sn—Ag type, a Sn—Zn type and a Au—Sn type can be used.

Copper type metals and aluminum type metals having excellent heat radiation property are generally used for the heat spreader 4 for supporting and fixing the support electrode body 3. Because the support electrode body 3 is pushed into the heat spreader 4, the Vickers hardness of the material of the heat spreader 4 is preferably lower than the Vickers hardness of the material of the support electrode body 3. In this case, because deformation of the heat spreader 4 is great and deformation of the support electrode body 3 can be restricted, breakage of the semiconductor chip 1 and peel of the insulating member 7, that result from deformation of the support electrode body 3, can be prevented. For example, it is advisable to use the aluminum type alloy for the heat spreader 4 and the copper type alloy for the support electrode body 3.

As described above, the support electrode body 3 is bonded to the semiconductor chip 1 generally by soldering. In this soldering process, temperatures of from about 200 to about 400° C. are applied once to five times to the support electrode body 3. In some of the copper type alloys such as oxygen-free copper, annealing occurs due to this temperature load and the Vickers hardness drops. On the other hand, the heat spreader 4 does not generally receive the thermal load that induces annealing. Therefore, when the same copper type alloy is used for the support electrode body 3 and the heat spreader 4, in some cases, the Vickers hardness becomes greater in the heat spreader 4 that does not receive the thermal load. In this case, the support electrode body 3 undergoes large deformation at the time of push-in, and there is a large possibility that breakage of the semiconductor chip 1 and peel between the insulating member 7 and the support electrode 3 occur.

Breakage of the semiconductor chip 1 and peel of the insulating member 7 that result from deformation of the support electrode body 3 can be prevented if the Vickers hardness of the support electrode body 3 is greater than the Vickers hardness of the heat spreader 4 at the time of the push-in operation after the load of the soldering temperature is applied. It is therefore desirable to use those materials, for the support electrode body 3, which do not invite the drop of the Vickers hardness even when the soldering temperature is applied. In the case of the copper type alloys, preferred examples include zirconium copper, tin-containing copper, silver-containing copper and chromium-containing copper.

The Vickers hardness is measured in accordance with the JIS B7725 standard. The JIS B7725 standard defines the Vickers hardness as follows.

A dent is formed on a test surface by a diamond square pyramid push-in element having a diagonal angle of 136°, and the Vickers hardness is determined from the test load and the surface area obtained by the length of the diagonal line of the dent, in accordance with the formula below:

$$HV=0.102F/S=0.102(F\sin(\theta/2))/d^2 =0.1891F/d^2$$

where F: test load (N),
S: surface area of dent (mm$^2$)
D: mean value of diagonal line length of dent (mm)
θ: diagonal surface angle of diamond push-in element Measurement of the support electrode body 3 is effected on the back of its semiconductor chip mounting surface. The heat spreader 4 is measured within the range of a diameter greater about twice the maximum outer diameter of the support electrode body 3 from the center of the round fitting hole. If the measurement portion is plated, the Vickers hardness is measured after plating is removed by means such as grinding.

The insulating member 7 is used to insulate and seal the bond portion between both electrodes 3, 6 and the semiconductor chip 1. The results of the experiments and numerical analyses conducted by the present inventor about the influences of the Young's modulus of the insulating member 7 and its coefficient of linear expansion on thermal fatigue life of the semiconductor device have revealed that the allowable value of thermal fatigue life can be exceeded when the Young's modulus of the insulating member 7 within the range of the temperature of its use is at least 5 GPa and the coefficient of linear expansion within the range of the temperature of its use is from 5 to 50 ppm/°C.

Figure 7:
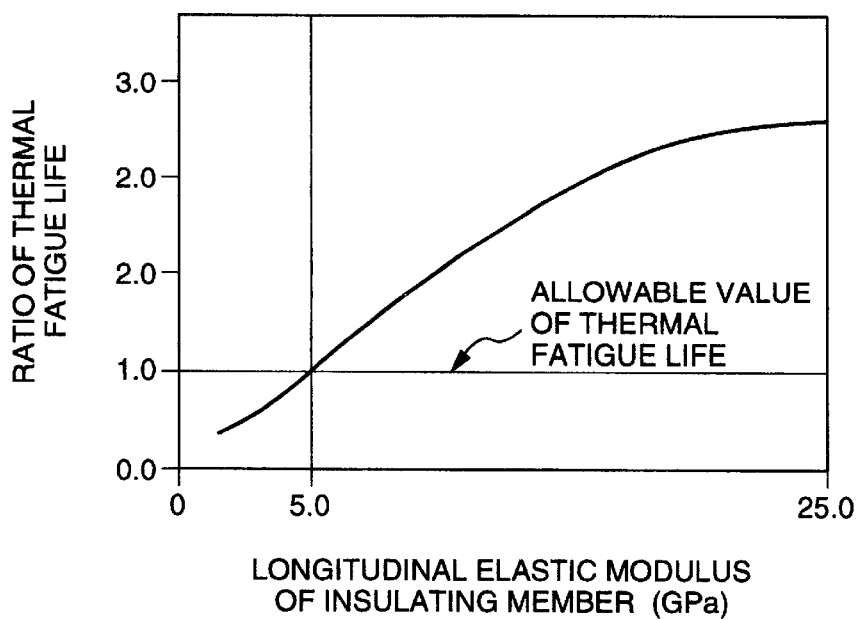
FIG. 7 is a graph showing the relation between Young's modulus of the insulating member and thermal fatigue life of the semiconductor device.
Figure 8:
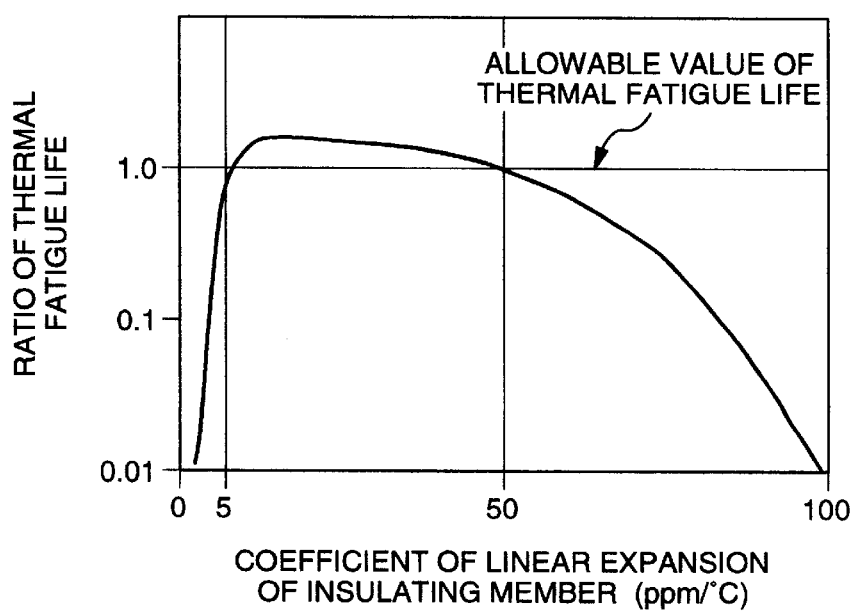
FIG. 8 is a graph showing the relation between a coefficient of linear expansion of the insulating member and thermal fatigue life of the semiconductor device.

FIG. 7 shows the relation between the Young's modulus of the insulating member 7 and thermal fatigue life of the semiconductor device, and FIG. 8 shows the relation between the coefficient of linear expansion of the insulating member and thermal fatigue life of the semiconductor device. The coefficient of linear expansion of the semiconductor chip 1 is about 3 ppm/°C. and that of the copper type alloy that is generally used for the support electrode body 3 and for the lead electrode body 6 is approximately 17 ppm/°C. Therefore, when any temperature fluctuation resulting from exothermy of the semiconductor chip and from the ambient temperature is applied to the semiconductor device, repetition of strains occurs in the boding members 2 and 5 for bonding the semiconductor chip and both electrode bodies 3 and 6 and fatigue failure occurs eventually in the bonding members 2 and 5. This fatigue failure determines in most cases product life of the semiconductor device. If the Young's modulus of the insulating member 7 and its coefficient of linear expansion are within the ranges of the numerical values described above, the insulating member 7 can play the function of bringing the thermal expansion of the semiconductor chip 1 close to that of both electrode bodies 3 and 5. The insulating member 7 can also play the function of reducing the stress concentration between the semiconductor chip 1 and the bonding end portions of the bonding members 2 and 5 of both electrode bodies 3 and 6. Owing to these effects, the strain occurring in the bonding members 2 and 5 can be reduced and thermal fatigue life of the semiconductor device can be improved beyond the allowable values.

An epoxy resin is generally used for this insulating member 7, and is molded by transfer molding into the circular truncated cone having the sectional shape shown in FIG. 1. Molding may be carried out by potting, too. According to these molding methods, small voids are sometimes formed inside the insulating member 7 but the effect of improving thermal fatigue life remains unchanged. When thermal fatigue life need not be long, in particular, a silicone rubber, or the like, may be used for the insulating member 7.

There is the possibility that adhesive strength between the insulating member 7 and the support electrode body 3 drops in the course of use for an extended period and the insulating member 7 is spaced apart from the support electrode body 3. Particularly because the epoxy resin is not free from the drop of adhesive strength due to degradation of the resin itself and due to moisture absorption, means must be employed so as to prevent fall-off the insulating member 7 from the support electrode body 3.

To prevent fall-off of the insulating member 7, this embodiment forms a cylindrical side wall 3a on the semiconductor chip mounting surface side of the support electrode body 3, and sets the inner diameter e of the lower part of the side wall, that continues the support electrode body 3, to a diameter greater than the inner diameter f at an upper part of the side wall. For a similar purpose, this embodiment forms a protuberance 6c at a part of a lead 6b extending up from a header portion 6a of the lead electrode body 6 in such a fashion as to come into contact with the insulating member 7 either partially or wholly.

The side surface of the semiconductor chip 1 is preferably sealed by an insulating/sealing material lest a moisture enters a part of the semiconductor chip 1, though the insulating/sealing material is not shown in the drawings. A polyimide resin having high heat resistance and high sealability is an example of the insulating/sealing material.

[Second Embodiment]

Figure 9:
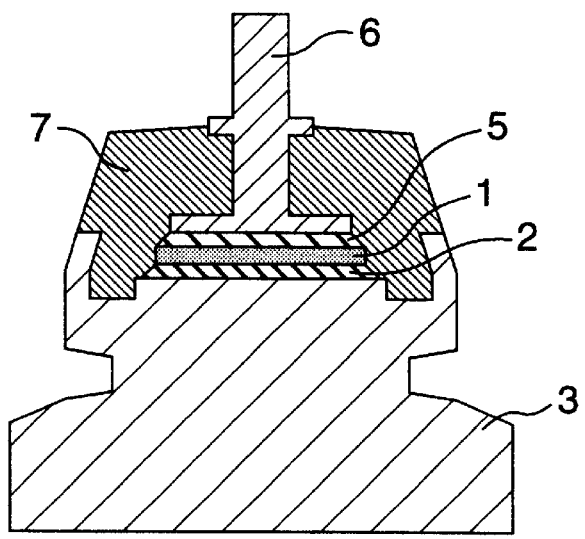
FIG. 9 is a sectional view of a semiconductor device according to the second embodiment of the present invention.

FIG. 9 is a sectional view showing a semiconductor device according to the second embodiment of the present invention. A ditch extending in a circumferential direction is defined in the support electrode body 3 between the circular cylindrical portion or the circular truncated conical portion on the semiconductor chip mounting surface side and the portion which is in contact with the heat radiation plate 4.

According to this construction, the force transferred from the contact portion, which comes into contact with the heat spreader 4 at the time of the push-in operation, is cut off by the intermediate thin portion. In consequence, the force applied to the semiconductor chip can be reduced drastically.

[Third Embodiment]

Figure 10:
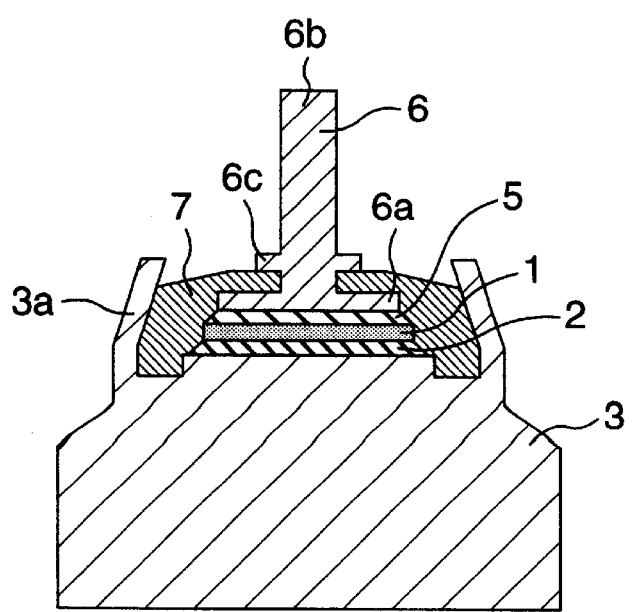
FIG. 10 is a sectional view of a semiconductor device according to the third embodiment of the present invention.

FIG. 10 is a sectional view showing a semiconductor device according to the third embodiment of the present invention. The insulating member 7 covers the header 6a of the lead electrode body 6 but need not keep contact with entire side wall 3a of the support electrode body 3. When the insulating member 7 is molded by potting, the shape shown in FIG. 10 can be molded more easily than the shape shown in FIG. 1. The effect of the improvement in thermal fatigue life of the bonding members 2 and 5 remains unchanged even in such a shape.

[Fourth Embodiment]

Figure 11:
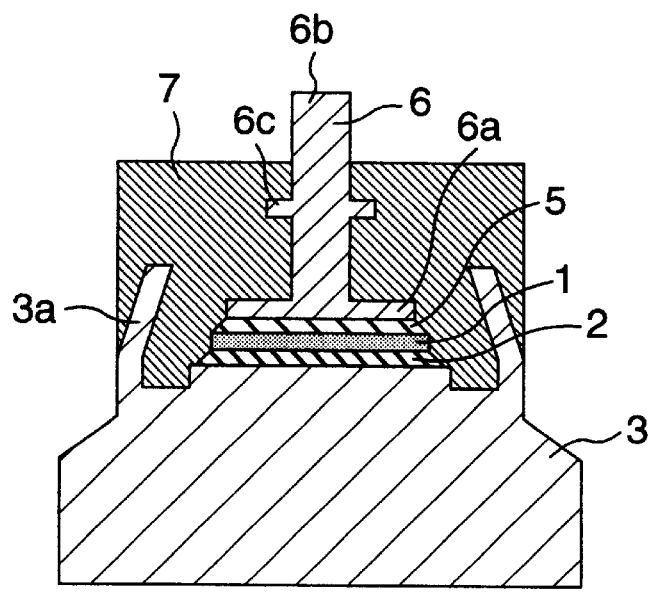
FIG. 11 is a sectional view of a semiconductor device according to the fourth embodiment of the present invention.

FIG. 11 is a sectional view showing a semiconductor device according to the fourth embodiment of the present invention. The insulating member 7 may cover the outside of the side wall 3a of the support electrode body 3. When the insulating member 7 is molded by transfer molding, the shape shown in FIG. 11 can be molded more easily than the shape shown in FIG. 1. The effect of the improvement in thermal fatigue life of the bonding members 2 and 5 remains unchanged even in such a shape.

[Fifth Embodiment]

Figure 12:
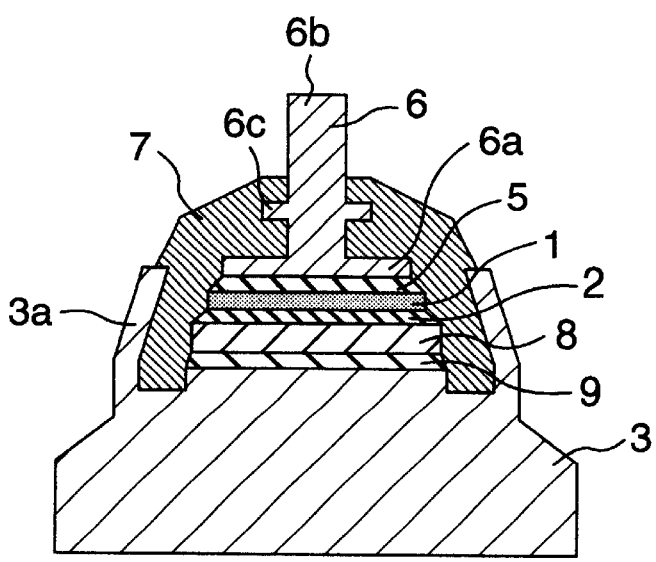
FIG. 12 is a sectional view of a semiconductor device according to the fifth embodiment of the present invention.

FIG. 12 is a sectional view showing a semiconductor device according to the fifth embodiment of the present invention. The semiconductor chip 1 is bonded to the semiconductor chip mounting plate 8 through the bonding member 5, and the semiconductor chip mounting plate 8 and the support electrode body 3 are bonded through the bonding member 9.

The material of the semiconductor chip mounting plate 8 preferably has a coefficient of linear expansion which is closer to the coefficient of linear expansion of the semiconductor chip 1 than to the coefficient of linear expansion of the support electrode body 3. Preferred examples include molybdenum, a copper-Invar-copper cladding material, tungsten and iron type alloys.

When the semiconductor chip 1 is mounted to the support electrode body 3 through the semiconductor chip mounting plate 8, the force that is transferred from the support electrode body 3 to the semiconductor chip 1 at the time of the push-in operation can be reduced. Also, fatigue life of the bonding member 5 can be improved.

[Sixth Embodiment]

Figure 13:
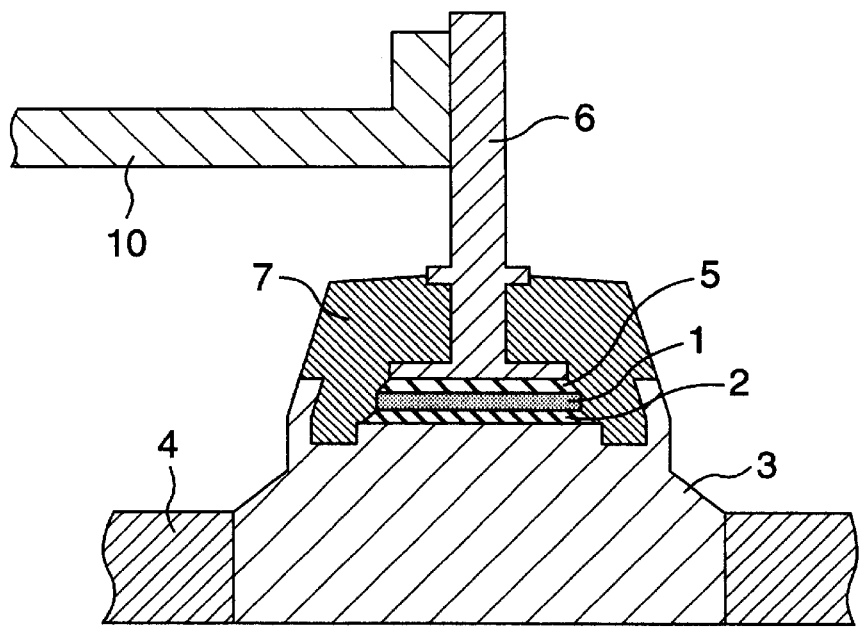
FIG. 13 is a sectional view of a semiconductor device according to the sixth embodiment of the present invention.

FIG. 13 is a sectional view showing a semiconductor device according to the sixth embodiment of the present invention, and also showing a part of a power source device.

The semiconductor device demonstrated in the first embodiment is pushed in, and fixed to, the heat spreader 4 as a part of a power source device, and the lead electrode body 6 is fixed to the terminal 10, which is electrically connected to the power source device, by means such as welding.

The push-in operation is generally carried out by push-ing the back side of the semiconductor device on the opposite side to the semiconductor chip mounting surface of the support electrode body 3 into the heat spreader 4 on the surface (not shown) greater than the back surface of the semiconductor chip mounting surface of the support electrode body 3. Therefore, the back of the semiconductor mounting surface of the support electrode body 3 exists generally on the same plane as the surface of the heat spreader 4 on the push-in start side, at the time of the push-in/fixing operation. However, not problem at all occurs even when they do not exist on the same fixing plane provided that the support electrode body 3 is sufficiently fixed to the heat spreader 4 and a contact area is secured to such an extent that heat radiation performance renders no problem.

In order to reduce the force applied to the semiconductor chip 1 to minimum, the thickness of the maximum outer diameter portion is preferably substantially equal to the depth of the fitting hole defined in the heat spreader 4. However, no practical problem occurs even when the thickness of the maximum outer diameter portion of the support electrode body 3 is smaller, or greater, than the depth of the fitting hole, provided that the support electrode body 3 is sufficiently fixed to the heat spreader and a contact area is secured to such an extent that heat radiation performance renders no problem.

In some cases, the terminal 10 compulsively causes the lead electrode body 6 to undergo deformation depending on the change of the ambient temperature. However, damage imparted to the insulating member 7 and the bonding member 2 is small because such deformation is absorbed by bending deformation of the lead 6b of the lead electrode body 6.

The power source device can be assembled by a simple push-in method by using the semiconductor device according to the presented invention as typified by this embodiment. Therefore, the power source device having high reliability can be achieved at a low cost of production.

[Seventh Embodiment]

Figure 14:
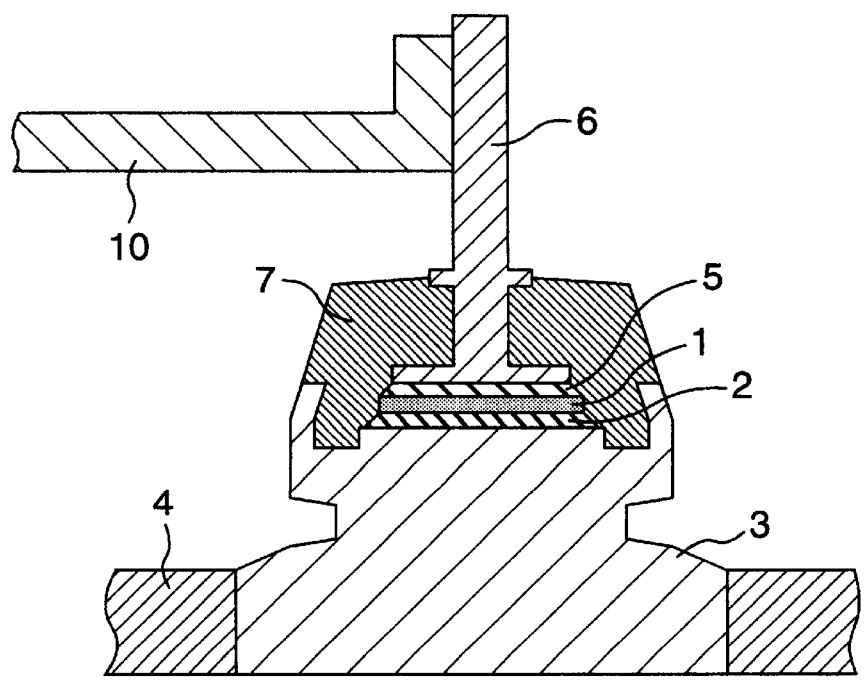
FIG. 14 is a sectional view of a semiconductor device according to the seventh embodiment of the present invention.

FIG. 14 is a sectional view showing a semiconductor device according to the seventh embodiment of the present invention and also showing a part of a power source device.

The semiconductor device represented by the second embodiment is pushed in, and fixed to, the heat spreader 4 as a part of a power source device and is fixed to the terminal 10, which is electrically connected to the power source device, by means such as welding. Because the difference is great between the maximum outer diameter of the support electrode body 3 keeping contact with the heat spreader 4 and the outer diameter of the portion immediately above the former, the force applied from the heat spreader 4 can be absorbed more greatly.

The power source device can be assembled by a simple push-in method by using the semiconductor device according to the present invention as typified by this embodiment. Therefore, a power source device having high reliability can be achieved at a low cost of production.

The semiconductor device according to the present invention can be applied to a broad range of applications, for example, electric equipment of automobiles.

What is claimed is:

1. A semiconductor device comprising:

a semiconductor chip;

a support electrode body bonded to one of the end portions of said semiconductor chip through a first bonding member and equipped around the outer periphery thereof with a heat spreader fixing portion for supporting and fixing a heat spreader;

a lead electrode body bonded to the other end portion of said semiconductor chip through a second bonding member; and an insulating/sealing member disposed at the bond portion between said semiconductor chip and said support electrode body and at the bond portion between said semiconductor chip and said lead electrode body, wherein said support electrode body includes a first portion having an outer diameter different from that of said heat spreader fixing portion, and wherein the outer diameter of said first portion is not greater than 0.95 times the outer diameter of said heat spreader fixing portion.

2. A semiconductor device according to claim 1, wherein a cylindrical side wall is formed on the semiconductor chip mounting surface side of said support electrode body, and an inner diameter of said side wall on the opposite side to said support electrode body side is smaller than an inner diameter on the support electrode body side.

3. A semiconductor device according to claim 1, wherein the thickness obtained by subtracting the thickness of the portion of said support electrode body, which is in contact with said heat spreader from the semiconductor chip mounting surface, from the thickness of said support electrode is from 0.07 to 0.25 times, or at least 0.47 times, the maximum outer diameter of said support electrode body.

4. A semiconductor device according to claim 1, wherein a second portion is defined in said support electrode body between said heat spreader fixing portion and said first portion, and the outer diameter of said second portion is smaller than the outer diameter of said support electrode fixing portion and the outer diameter of said first portion.

5. A semiconductor device according to claim 1, wherein a sheet-like member is interposed between said semiconductor chip and said support electrode body.

6. A semiconductor device according to claim 1, wherein a cylindrical side wall is formed on said support electrode body on the semiconductor chip mounting surface side, and an inner diameter of said side wall on the opposite side to the support electrode side is smaller than the inner diameter on the support electrode body side.

7. A semiconductor device according to claim 1, wherein the thickness obtained by subtracting the thickness of the portion of said support electrode body, which is in contact with said heat spreader from the semiconductor chip mounting surface, from the thickness of said support electrode body is from 0.07 to 0.25 times, or at least 0.47 times, the maximum outer diameter of said support electrode body.

8. A semiconductor device according to claim 1, wherein a first portion is formed on said support electrode body between said heat radiation plate fixing portion and said first portion, and the outer diameter of said second portion is smaller than the outer diameter of said support electrode fixing portion and the outer diameter of said first portion.

9. A semiconductor device according to claim 1, wherein a sheet-like member is interposed between said semiconductor chip and said support electrode body.

10. A semiconductor device according to claim 1, wherein a ditch in a circumferential direction is formed between a circular cylindrical portion or a circular truncated conical portion on the semiconductor chip mounting side and the contact portion which is in contact with said heat spreader.

11. A semiconductor device according to claim 1, wherein Young's modulus of said insulating member within the range of temperature of use is at least 5 GPa, and a coefficient of linear expansion of said insulating member within the range of temperature of use is from 5 to 50 ppm/°C.

12. A semiconductor device according to claim 1, wherein the Vickers hardness of said support electrode body is greater than the Vickers hardness of said heat spreader into which said support electrode body is pushed.

13. A semiconductor device according to claim 1, wherein zirconium copper or tin-containing copper or silver-containing copper or chromium-containing copper is used for said support electrode.

14. A semiconductor device comprising:
a semiconductor chip;
a support electrode body bonded to one of the end portions of said semiconductor chip through a first bonding member and equipped around the outer periphery thereof with a heat spreader fixing portion for supporting and fixing a heat spreader;
a lead electrode body bonded to the other end portion of said semiconductor chip through a second bonding member; and
an insulating/sealing member disposed at the bond portion between said semiconductor chip and said support electrode body and at the bond portion between said
wherein said support electrode body includes a first portion having a first outer diameter and a second portion disposed between said first portion and said heat spreader fixing portion and having a second outer diameter smaller than both said first outer diameter of said first portion and an outer diameter of said heat spreader fixing portion, and
wherein the outer diameter of said first portion is not greater than 0.95 times the outer diameter of said heat spreader fixing portion.

15. A semiconductor device comprising:
a semiconductor chip;
a semiconductor chip mounting plate;
a support electrode body bonded to one of the end portions of said semiconductor chip through a first bonding member, said semiconductor chip mounting plate and a third bonding member, and equipped around the outer periphery thereof with a heat spreader fixing portion for supporting and fixing a heat spreader;
a lead electrode body bonded to the other end portion of said semiconductor chip through a second bonding member; and
an insulating/sealing member disposed at the bond portion between said semiconductor chip and said support electrode body and at the bond portion between said semiconductor chip and said lead electrode body,
wherein said support electrode body includes a first portion having an outer diameter different from that of said heat spreader fixing portion, and
wherein the outer diameter of said first portion is not greater than 0.95 times the outer diameter of said heat spreader fixing portion.

16. A semiconductor device according to claim 1, wherein said semiconductor device is a rectifier.

17. A semiconductor device according to claim 14, wherein said semiconductor device is a rectifier.

18. A semiconductor device according to claim 15, wherein said semiconductor device is a rectifier.

19. A semiconductor device according to claim 15, wherein said semiconductor chip mounting plate has a coefficient of linear expansion closer to the coefficient of linear expansion of the semiconductor chip than to the coefficient of linear expansion of the support electrode body.

* * * * *